(12) United States Patent
Okandan

(10) Patent No.: US 11,621,542 B2
(45) Date of Patent: Apr. 4, 2023

(54) MICROSYSTEMS AND SEMICONDUCTOR HYBRID COHERENT LIGHT SOURCES

(71) Applicant: Murat Okandan, Edgewood, NM (US)

(72) Inventor: Murat Okandan, Edgewood, NM (US)

(*) Notice: Subject to any disclaimer, the term of this patent is extended or adjusted under 35 U.S.C. 154(b) by 332 days.

(21) Appl. No.: 16/954,203

(22) PCT Filed: Nov. 16, 2018

(86) PCT No.: PCT/US2018/061683
§ 371 (c)(1),
(2) Date: Jun. 16, 2020

(87) PCT Pub. No.: WO2019/099945
PCT Pub. Date: May 23, 2019

(65) Prior Publication Data
US 2020/0350745 A1     Nov. 5, 2020

Related U.S. Application Data

(60) Provisional application No. 62/586,896, filed on Nov. 16, 2017.

(51) Int. Cl.
*H01S 5/40*     (2006.01)
*G02B 6/42*     (2006.01)
*H01S 5/42*     (2006.01)

(52) U.S. Cl.
CPC .......... *H01S 5/4068* (2013.01); *G02B 6/4214* (2013.01); *H01S 5/4062* (2013.01); *H01S 5/423* (2013.01)

(58) Field of Classification Search
CPC ...... H01S 5/4068; H01S 5/4062; H01S 5/423; H01S 5/4025; G02B 6/4214
See application file for complete search history.

(56) References Cited

U.S. PATENT DOCUMENTS

| | | | | |
|---|---|---|---|---|
| 4,101,845 | A * | 7/1978 | Russer | ............... H01S 5/06213 372/50.1 |
| 4,722,089 | A | 1/1988 | Botez et al. | |
| 4,907,234 | A * | 3/1990 | Goldberg | ............... H01S 5/4006 372/18 |
| 2003/0197918 | A1* | 10/2003 | Ng | ............... H01S 5/4006 359/332 |
| 2005/0244994 | A1 | 11/2005 | Meliga et al. | |
| 2009/0097511 | A1* | 4/2009 | Mohrdiek | ............... H01S 5/146 372/38.07 |
| 2010/0189136 | A1* | 7/2010 | Gapontsev | ............... H01S 3/06754 372/6 |

(Continued)

FOREIGN PATENT DOCUMENTS

WO     2019099945  A1     5/2019

OTHER PUBLICATIONS

"International Search Report for PCT Patent Application No. PCT/US2018/061683", dated Mar. 8, 2019, 4 Pages.

(Continued)

*Primary Examiner* — Xinning(Tom) Niu
(74) *Attorney, Agent, or Firm* — Calfee, Halter & Griswold LLP

(57) ABSTRACT

A laser array (100) is described herein, wherein the laser array comprises semiconductor lasers (102, 104) that are precisely controlled such that an optical beam output by the laser array has desired shape and direction.

20 Claims, 6 Drawing Sheets

(56) References Cited

U.S. PATENT DOCUMENTS

2015/0168737 A1* 6/2015 Yang .................... G02B 5/3083
                   359/489.08
2016/0218484 A1   7/2016 Lealman
2018/0331500 A1* 11/2018 Cheung ................ H01S 5/4068

OTHER PUBLICATIONS

"Written Opinion of the International Searching Authority for PCT Patent Application No. PCT/US2018/061683", dated Mar. 8, 2019, 6 Pages.

* cited by examiner

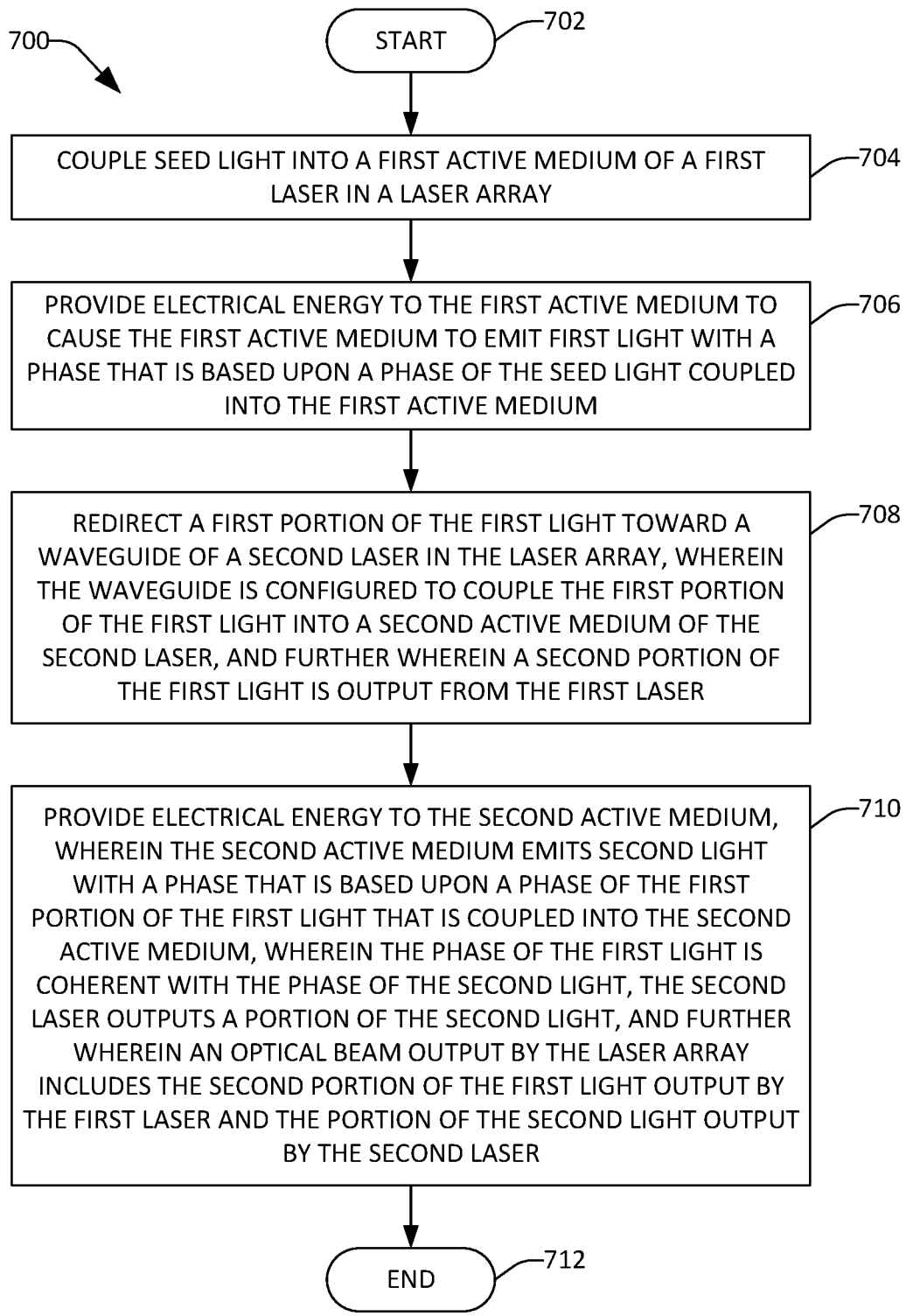

MICROSYSTEMS AND SEMICONDUCTOR HYBRID COHERENT LIGHT SOURCES

RELATED APPLICATION

This application claims priority to U.S. Provisional Patent Application No. 62/586,896, filed on Nov. 16, 2017, and entitled "MICROSYSTEMS AND SEMICONDUCTOR HYBRID COHERENT LIGHT SOURCES". The entirety of this application is incorporated herein by reference.

BACKGROUND

Arrays of coherent lasers have been developed and utilized for a wide variety of applications. Arrays of fiber lasers have conventionally been deployed for applications that require high power output and precise control of optical beam properties. In such applications, however, fiber lasers are operated at the edge of nonlinear effects and damage thresholds of materials in the fiber lasers, rendering it difficult to improve a laser system and/or optimize a laser system that relies upon fiber lasers. In addition, a laser system that includes an array of fiber lasers requires an initial "pump laser" stage, which reduces the overall energy efficiency of the laser system (where energy efficiency is determined by dividing optical energy output by electrical energy required to drive the laser system). To address the aforementioned deficiencies of laser arrays that are composed of fiber lasers, laser arrays composed of semiconductor lasers have been developed, wherein these laser arrays exhibit efficiency and performance improvements over fiber laser-based laser arrays. Laser arrays composed of semiconductor lasers, however, conventionally are unable to provide sufficient coherence for some applications, and are further unable to control certain optical beam properties, wherein control of such properties is desired for certain applications.

SUMMARY

The following is a brief summary of subject matter that is described in greater detail herein. This summary is not intended to be limiting as to the scope of the claims.

Described herein are various technologies pertaining to a laser array that is composed of a plurality of individually-controllable semiconductor lasers, such that an optical beam output by the laser array is composed of output beams from the lasers that have high coherence with one another. The laser array described herein is particularly well-suited for applications that require relatively high optical energy output, wherein such output is generated through use of a relatively low amount of electrical energy (e.g., the laser array exhibits higher energy efficiency when compared to conventional fiber-based laser arrays). Exemplary applications include but are not limited to propulsion in space, power delivery in space, power delivery in the atmosphere or on the ground, materials processing, or other suitable applications where an optical beam of controlled intensity and or beam shape is desired.

The laser array referenced above includes several semiconductor lasers. An exemplary laser that is included in the laser array is a hybrid assembly that comprises a semiconductor light-emitting layer (where the semiconductor is a compound semiconductor), micro-electromechanical systems (MEMS) components, and a silicon integrated circuit (IC). With more specificity, a laser described herein can include numerous layers. For instance, the laser can include a thermal management/electrical routing layer that is configured to control temperature of the laser (e.g., by flowing fluid through fluid channels in the thermal management/electrical routing layer). The thermal management/electrical routing layer can comprise through silicon vias to deliver electrical energy from an energy source to other layers in the laser. The laser can additionally include a silicon IC that is electrically coupled to the thermal management/electrical routing layer, wherein the silicon IC comprises a microcontroller and an array of optical sensors. The laser further comprises an active medium formed of a semiconductor (a compound semiconductor such as gallium arsenide) that is electrically coupled to the IC. The microcontroller of the silicon IC is configured to control electrical energy provided to the active medium as well as control components of other layers in the laser, as described herein.

The laser further includes a waveguide layer that is optically coupled to the active medium, wherein the waveguide layer is configured to couple light received at the waveguide layer into the active medium. Light coupled into the active medium by way of the waveguide layer acts to at least partially define wavelength and phase of light emitted from the active medium. The laser further includes a micro-electromechanical systems (MEMS) reflector/actuator layer that is separated from the active medium by a spacer layer that has conductive rods extending therethrough. The MEMS reflector/actuator layer includes a light directing element, wherein position of the light directing element (e.g., longitudinal position in the laser and tip and tilt of the light directing element) can be precisely controlled. The spacer layer includes an external cavity between the MEMS reflector/actuator layer and the active medium, such that light emitted from the active medium traverses through the external cavity prior to exiting the laser. The conductive rods act to electrically couple componentry in the MEMS reflector/actuator layer with the silicon IC, such that the microcontroller of the silicon IC can control position of the light directing element relative to the active medium (e.g., through electrostatic actuation). In an exemplary embodiment, the light directing element can be or include a mirror, a grating, multiple mirrors, multiple gratings, one or more lenses, etc. The light directing element is configured to do any of the following: reflect light emitted by the active medium back through the cavity towards the active medium; redirect a portion of the light emitted from the active medium to the array of optical sensors on the silicon IC; redirect a portion of the light emitted from the active medium to a waveguide or active medium of an adjacent laser; allow light emitted from the active medium to exit the cavity. Hence, a portion of the light emitted by the active medium of the laser can be utilized to at least partially define wavelength and phase of an adjacent laser in the laser array.

In addition, the array of optical sensors on the semiconductor IC of the laser can additionally receive light reflected by a light directing element of the same laser or an adjacent laser in the laser array, and the microcontroller can control properties of the laser based upon sensor signals output by sensors in the array of optical sensors in response to detecting light directed to the sensors by the light directing element of the laser and/or detecting light directed to the sensors by a light directing element of an adjacent laser in the laser array. For instance, the microcontroller can cause temperature of the active medium to be altered based upon the sensor signals, may cause an amount of electrical energy provided to the active medium to be altered based upon the sensor signals, can adjust a position of the light directing element based upon the sensor signals, and so forth.

The aforementioned layers of the laser described above can be manufactured using micro-fabrication techniques and assembled using wafer bonding, chip bonding, and assembly approaches used in microelectronics manufacturing methods. This allows for highly reliable manufacture of lasers in the laser array and high-yield integration of the layers of each laser.

As referenced above, a key requirement for high system performance is precise wavelength and phase control across lasers in the laser array, which in turn allows for the optical beam output by the laser array to be controlled to achieve a desired output pattern. In an exemplary embodiment, control of the output optical beam can be accomplished through use of a seed laser beam that is distributed across lasers in the laser array at fairly low power levels and fed into the active medium of the lasers in the laser array. The coupling of a seed laser beam into an active medium of a laser is achieved by the waveguide layer referenced above, which directs the seed laser light received by the waveguide layer into desired locations of the active medium or by direct free space coupling of the seed laser into the active regions of the lasers. Electrical contacts on the active medium bring carriers (electron and holes), which recombine in the active medium with a pattern determined by the device features. For instance, the laser can be the designed such that the recombination and resulting light output from the active medium varies or remains constant across physical dimensions of the active medium. As noted above, photons generated by the active medium travel in an external cavity of the spacer layer, where the cavity is defined by an assembly of interposer layers and actively controlled optical microcomponents, such as a reflector, grating, phase shift layer, another cavity, or some combination thereof.

Further, sensors and other control electronics are integrated as silicon IC components, wherein such components can include image sensors, digital and analogic components to process information and control other components of the laser and communicate with other lasers in the array, or other power and data control electronics in the laser array. A precise timing element, such as a chip-scale atomic clock, can be included in the laser array to provide timing and control features for the laser system.

In addition, the thermal management/electrical routing layer can be configured to remove excess heat away from the laser as well as cause the active medium to maintain a stable (desired) temperature within a relatively small range; for example, temperature can be maintained within a 1 mK, 10 mK, or 100 mK range. The thermal management/electrical routing layer can include integrated temperature sensors, heaters, thermal conduction features (such as micro-channels, heat transfer fluids and/or layers) and heat sinks, which allow for relatively precise control of the thermal environment. In addition, control of temperature allows for tuning wavelength of light emitted from the active medium.

As referenced above, the silicon IC can include optical sensor arrays embedded therein, which are configured to provide for detection of light that is generated and amplified in the laser. For instance, the optical sensor arrays can include complementary metal-oxide semiconductor (CMOS) imaging arrays, and interference effects can be detected based upon signals output by such optical sensors, where the interference effects are a function of optical components in the laser (such as gratings, etalon cavities, reflectors, or combinations thereof). The interference effects can correspond to light within a cavity of the laser or light that is combined among cavities. Based upon detected interference effects, wavelength, phase, and position/pointing information of the output beam of the laser array can be controlled precisely and at high speed. For instance, outputs of sensors in the optical sensor array allow for position information of optical elements that are in the cavity or that form the cavity be obtained with relatively high precision and at high speed. Lasers in the laser array can be controlled to achieve uniform or precisely offset parameters, such as varying wavelength and/or phase offsets. This type of control is achieved by physically modulating the position or size of the componentry of the cavity, by electrically and/or thermally modulating the active medium, etc. In addition to using phased-array methods to control the pointing of the output optical beam, physical modulation (pointing, tilting or warping) of the elements such as a grating or mirror in the cavity and/or the optical elements such as lenses in the stack also provide additional control of the output optical beam.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

BRIEF DESCRIPTION OF THE DRAWINGS

FIG. 7 is a flow diagram illustrating an exemplary methodology for operating a laser array.

DETAILED DESCRIPTION

Figure 1:
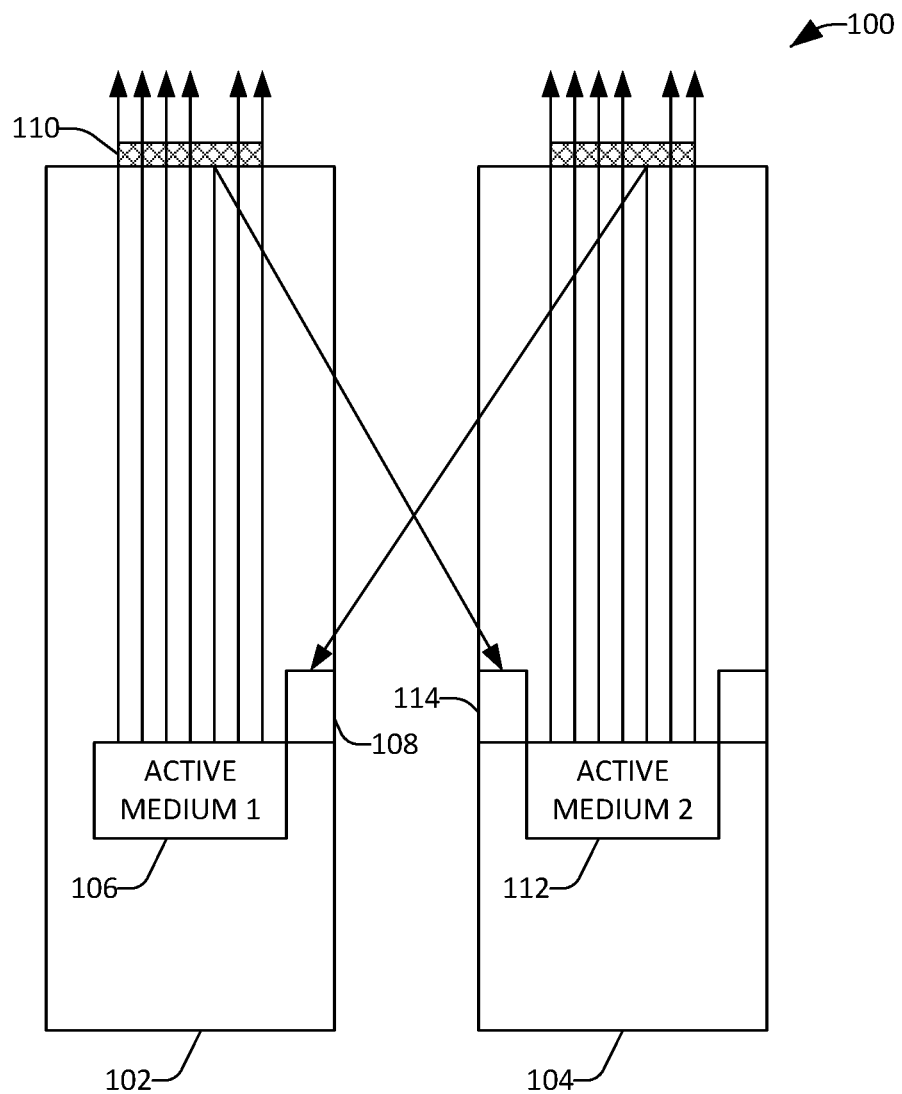
FIG. 1 is a schematic of two adjacent lasers in a laser array.

Various technologies pertaining to a laser array are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

With reference now to FIG. 1, a schematic of a laser array 100 is illustrated. The laser array 100 comprises a first laser 102 and a second laser 104. While the first laser 102 and the second laser 104 are illustrated as having a space therebetween, such space is included for ease of illustration, and it is to be understood that the first laser 102 and the second laser 104 may be placed in contact with one another during operation of the laser array 100.

The laser array 100 is configured to generate an output optical beam that includes optical outputs of the first laser 102 and the second laser 104. As will be described in greater detail below, the optical outputs of the first laser 102 and the second laser 102 can be coherent. With more specificity, the first laser 102 can output a first output beam, the second laser 104 can output a second output beam, wherein the first output beam and the second output beam have matching wavelengths and tightly controlled phase offset (which may no phase offset) between the output beams. The first laser 102 includes a first active medium 106, wherein the first active medium 106 is configured to emit first light (represented by lines exiting the first active medium 106). For instance, the first active medium 106 can be formed of a semiconductor. In a more specific example, the first active medium 106 can be formed of a compound semiconductor, such as a III-V semiconductor (e.g., gallium arsenide (GaAs)). The first laser 102 additionally includes a first waveguide 108 that is optically coupled to the first active medium 106, such that light received by the first waveguide 108 can be coupled into the first active medium 106. Wavelength and phase of the first light emitted by the first active medium 106 is at least partially defined by the wavelength and phase of the light coupled into the first active medium 106 by way of the first waveguide 108. The first laser 102 also includes a controllable first light directing element 110, wherein position (e.g., longitudinal position, tip, and tilt) of the first light directing element 110 relative to the first active medium 106 can be controlled. For instance, the first light directing element 110 can be or include a mirror, a grating, or other suitable optical element.

In the exemplary laser array 100 illustrated in FIG. 1, the second laser 104 is constructed to be identical to the first layer 102. That is, the second laser 104 has a second active medium 112, wherein the second active medium 112 can be formed of the compound semiconductor (e.g., GaAs), and further wherein the second active medium 112 is configured to emit second light (represented by lines exiting the second active medium 112). The second laser 104 additionally includes a second waveguide 114 that is optically coupled to the second active medium 112. Hence, light received by the second waveguide 114 can be coupled into the second active medium 112 by way of the second waveguide 114. The wavelength and phase of the second light emitted by the second active medium 112 is at least partially defined by the wavelength and phase of light coupled into the second active medium 112 by way of the second waveguide 114. The second laser 104 also includes a controllable second light directing element 116, wherein position (e.g., longitudinal position, tip, and tilt) of the second light directing element 116 relative to the second active medium 112 can be controlled. The second light directing element 116 can be or include a mirror, a grating, or other optical element.

Operation of the laser array 100 is now described. The first active medium 106 and the second active medium 112 are provided with electrical energy (electrons and holes) through electrical contacts placed at appropriate locations on the active mediums 106 and 112, respectively. The first active medium 106 emits the first light in response to electrical energy being provided thereto and the second active medium 112 emits the second light in response to electrical being provided thereto. The first light director element 110 directs a portion of the first light emitted by the first active medium 106 towards the second waveguide 114 of the second laser 104. The second waveguide 114 receives the portion of the first light and couples the portion of the first light into the second active medium 112. The wavelength and phase of the second light emitted by the second active medium 112 is at least partially defined by the wavelength and phase of the light coupled into the second active medium 112 by way of the second waveguide 114; accordingly, wavelength and phase of the second light emitted by the second active medium 112 is at least partially defined by the wavelength and phase of the first light emitted by the first active medium 106.

Similarly, the second light directing element 116 directs a portion of the second light emitted by the second active medium 112 to the first waveguide 108 of the first laser 102. The first waveguide 108 receives the portion of the second light and couples the portion of the second light into the first active medium 106. Hence, wavelength and phase of the first light emitted by the first active medium 106 is at least partially defined by the wavelength and phase of the portion of the second light emitted by the second active medium 112 that has been coupled into the first active medium 106 by way of the first waveguide 108. Additionally, as referenced above, positions of the first light directing element 110 and the second light directing element 116 can be controlled relative to the first active medium 106 and the second active medium 112, respectively. Thus, for example, the position of the second light directing element 116 can be controlled to alter a phase of light emitted by the first active medium 106. Accordingly, outputs of the lasers 102 and 104 can be controlled to have identical wavelengths (or a precisely wavelength offset) and identical phases (or a precisely defined phase offset), which allows for shaping of the optical beam (which includes a combination of the outputs of the lasers 102 and 104) produced by the laser array 100, wherein the optical beam output by the laser array 100 has a relatively high optical energy with energy requirements for producing such optical beam being much lower when compared to the conventional laser arrays formed of fiber lasers. Coupling of the light from one laser to the other can also be achieved by directing a portion of the light directly into the active medium or into the reflective element of the adjacent elements.

Figure 2:
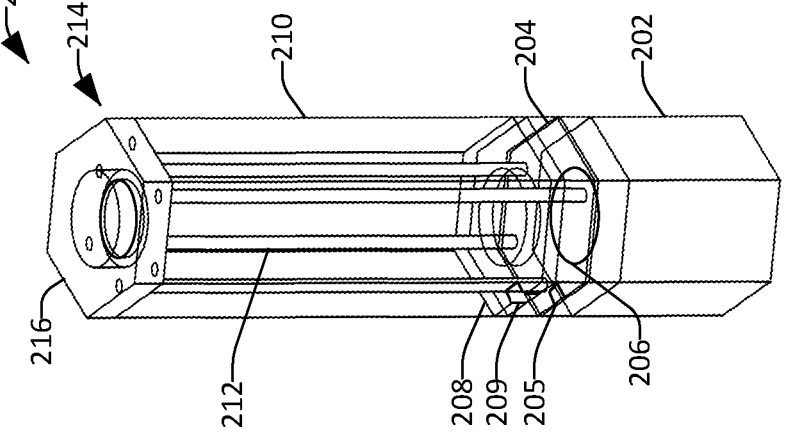
FIG. 2 is an exploded view of a laser that is included in a laser array.

Now referring to FIG. 2, an exploded view of an exemplary laser 200 that can be included in a laser array is illustrated. The exemplary laser 200 has a hexagon cross-section; however, the cross-section of the laser 200 may be of some other suitable shape, such as octagonal, square, rectangular, triangular, or the like. Further, in an exemplary embodiment, the laser 200 may have dimensions of approximately 4 mm in height by 1 mm in width.

The laser 200 comprises several layers, which will be described in detail below, starting at the bottom of the laser 200. The laser 200 includes a thermal management/electrical routing layer 202. In an exemplary embodiment, the thermal management/electrical routing layer 202 can be formed of silicon and may itself include routing layers and fluid layers for temperature control. The thermal management/electrical routing layer 202 is configured to remove excess heat from the laser 200, control temperature of the laser 200 such that a desired temperature can be maintained to within a relatively precise temperature range (e.g., within 1 mK, within 10 mK, within 100 mK, etc.). The thermal management/electrical routing layer 202 can include temperature sensors integrated therein, heaters integrated therein, thermal conduction features (such as micro-channels, heat transfer fluids and other suitable layers), and heatsinks therein, etc., such that relatively precise control of the thermal environment of the laser 202 is enabled. As wavelength of light emitted by an active medium is a function of temperature of the active medium, temperature of the thermal management/electrical routing layer 202 can be controlled to control wavelength of light emitted by an active medium in the laser 200.

The laser 200 additionally includes a silicon integrated circuit (IC) 204 that is electrically and thermally coupled to the thermal management/electrical routing layer 202. For example, the thermal management/electrical routing layer 202 can include through silicon vias (TSVs) by way of which electrical energy can be delivered to the silicon IC 204. The thermal management/electrical routing layer 202 can be coupled to the silicon IC 204 by way of bump bonds, conductive adhesive interconnects, and/or direct wafer bonding techniques. The silicon IC 204 comprises an optical sensor array 205 that includes sensors that output sensor signals responsive to light being incident upon the sensors (where the sensors can detect certain modulation of light incident upon the sensors), wherein the sensors can include photodiodes or other suitable light detecting elements. As shown in FIG. 1, and in example, the optical sensor array 206 can be positioned at the periphery of the laser 200 to allow for the sensors to receive light unimpeded by other layers of the laser 200. The silicon IC 204 also comprises a microcontroller (not shown) that is configured to control other componentry of the laser 200, as will be described in greater detail below.

The laser 200 further includes an active medium 206 that is coupled to the semi conductor IC 204. The active medium can be formed of a suitable semiconductor; in a specific example, the active medium 206 can be formed of a compound semiconductor such as GaAs. The active medium 206 can be coupled to the silicon IC 204 by way of pick and place techniques, by way of wafer layer transfer, or other suitable techniques. The active medium 206 has electrical contacts at desired positions on a surface thereof, such that holes and electrons can be delivered to the active medium 206 by way of the semiconductor IC 204 (where electrical energy is delivered to the semiconductor IC 204 by way of the thermal management/electrical routing layer 202). When holes and electrons are provided to the active medium 206 by way of the electrical contacts mentioned above, the active medium 206 emits light.

The laser 200 additionally comprises a waveguide layer 208 that is optically coupled to the active medium 206, such that light received by the waveguide layer 208 is coupled into the active medium 206. Wavelength and phase of light emitted by the active medium 206 is at least partially defined by wavelength and phase of light coupled into the active medium 206 by way of the waveguide layer 208. As will be described in greater detail below, seed light having a desired wavelength and phase can be directed to the waveguide layer 208, such that the active medium 206 emits light with the desired wavelength and phase. In another example, the waveguide layer 208 may receive light from another laser in a laser array (as illustrated in FIG. 1), such that wavelength and phase of light emitted by the active medium 206 is at least partially defined by wavelength and phase of light emitted by another laser in the array. As illustrated in FIG. 2, the waveguide layer 208 has an aperture extending therethrough such that light emitted by the active medium 206 is travels through the aperture and is not captured by the waveguide layer 208. The waveguide layer 208 can also include a notch (also referred to as a cutout) 209 therein that corresponds with a location of the optical sensor array 205 on the semi conductor IC 204. Hence, the waveguide layer 208 does not impede the optical sensor array 205 from receiving light.

The laser 200 additionally includes a spacer layer 210 that extends longitudinally from the waveguide layer 208 and has conductive rods 212 extending longitudinally therethrough. The conductive rods 212 may be coupled to the semi conductor IC 204. The spacer layer 210 can be formed of glass or other suitable polymer. The spacer layer 210 may additionally be drilled such that the conductive rods 212 can be positioned therein, and further may be drilled such that a hollow region exist to allow for unimpeded passage of light therethrough.

The laser 200 additionally includes a MEMS reflector layer 214. The MEMS reflector layer 214 includes a cap 216 with an aperture 218 extending therethrough, wherein the aperture 218 is in axial alignment with the aperture of the waveguide layer 208; hence, light exiting the laser 200 exits by way of the aperture 218. The MEMS reflector layer 214 also includes a light directing element 220 that is positioned in the aperture 218. The light directing element 220 can be or include a mirror, a grating, several mirrors, several ratings, a lens, several lenses, etc. In an example, the light directing element 220 is configured to allow some of the light traveling upwards through the spacer layer 210 to exit the laser 200 by way of the aperture 220 while reflecting other light emitted by the active medium 206 back through the spacer layer 210 and towards the active medium 206. In addition, the light directing element 220 can be configured to redirect light towards the optical sensor array 205 on the semiconductor IC 204. In yet another example, the light directing element 220 can be configured to redirect light towards an optical sensor array of an adjacent laser in the laser array that includes the laser 200. In still yet another example, the light directing element 220 can be configured to redirect light emitted by the active medium 206 to a waveguide of an adjacent laser in the laser array, such that the redirected light is coupled into the active medium of the adjacent laser. Position of the light directing element 220 relative to the active medium 206 can be controlled based upon signals provided to the conductive rods 212. For example, by way of electrostatic actuation with respect to the conductive rods 212, the light directing element 220 can be moved towards or away from the active medium 206 and/or tipped and/or tilted as desired relative to the active medium 206.

In an exemplary embodiment, the active medium 206 may be the only lasing element in the laser 200. In such an embodiment, a partially reflective material can be placed on the top and bottom of the active material 206, such that at least some light generated by the active medium 206 reflects back into the active medium 206 (while other light may exit the active medium 206. In such an embodiment, the light directing element 220 is not configured to reflect light back towards the active medium 206 through the cavity of the spacer layer 210, but is instead configured to allow light to pass therethrough while redirecting a portion of such light towards the optical sensor array 205 of the laser 200, an optical sensor array of an adjacent laser in a laser array, and/or a waveguide of an adjacent laser in the laser array. In another exemplary embodiment, the light directing element 220 may be configured to reflect at least some light emitted from the active medium 206 back towards the active medium, in which case the spacer layer 210 acts as a lasing element in the laser 200.

Construction of the laser 200 is now briefly described. The laser 200 illustrated in FIG. 2 can be formed using semiconductor processing techniques from microelectronics and packaging industries. For instance, one or more of the layers of the laser 200 can be formed using wafer-based fabrication techniques, such as silicon and compound silicon semiconductor processing techniques. The spacer layer 210 and the waveguide layer 208 can be created using machining and joining techniques used in packaging and glass processing. For example, the spacer layer 210 can be formed of glass, and the conductive rods 212 may be thin metal rods inserted into the glass (such as tungsten into quartz or other glass that is coefficient of thermal expansion (CTE)-matched to silicon) at a relatively low temperature, resulting in formation of a tight seal at room temperature. The spacer layer 210 can then be sliced, polished, and further drilled to form the hollow area for light propagation.

The silicon ICE 204 and active medium 206 can be bonded together using direct wafer bonding techniques or possibly with a polymeric/conductor embedded interposer. TSVs can be used to transmit electrical signals through the thermal management/electrical routing layer 202 to other layers in the stack.

Figure 3:
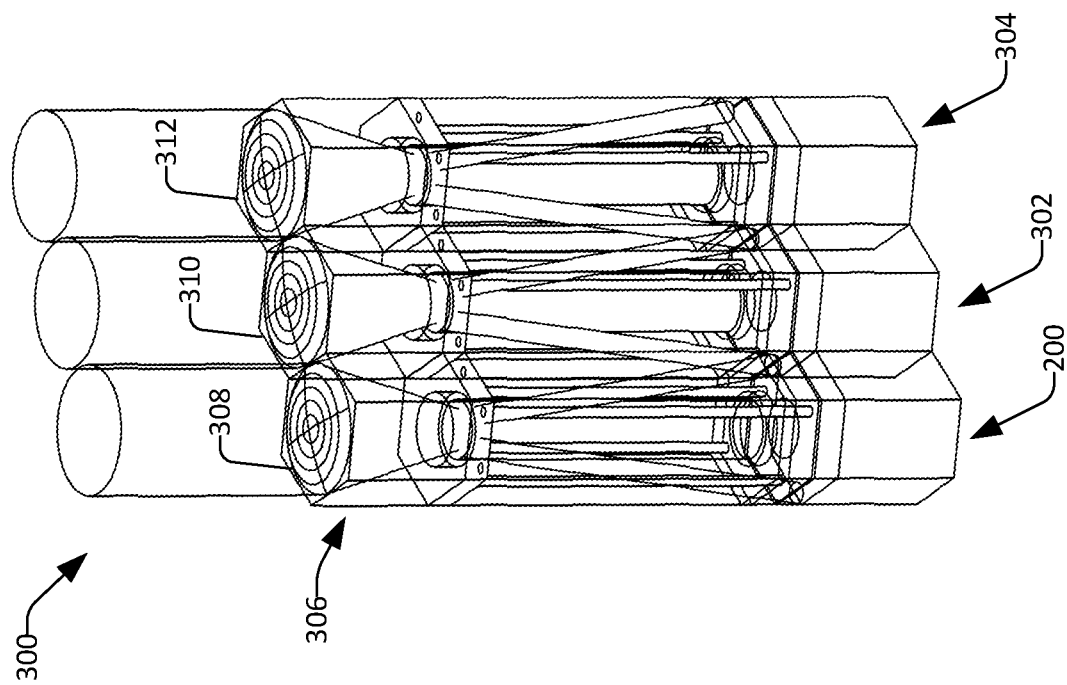
FIG. 3 is an isometric view of a plurality of adjacent lasers in a laser array.

With reference now to FIG. 3, an exemplary laser array 300 is illustrated, where in the laser 200 is included in the laser array 300. The laser array 300 additionally includes lasers 302 and 304, wherein the laser 302 is adjacent to the laser 200 and is between the laser 200 and the laser 304 in the laser array 300. Lasers 200, 302, and 304 are identical to one another in the example shown in FIG. 3. The laser 200 comprises an extended housing 306 that houses an optical element 308. For instance, the optical element 308 can be configured to collimate light that exits the laser 200 by way of the aperture 218. The lasers 302 and 304 include corresponding optical elements 310 and 312, respectively, that are configured to collimate, phase shift, direct, etc. light exiting the apertures of the lasers 302 and 304. In an example, the optical element 308 may be independently controlled by the microcontroller of the laser 204, and therefore can be moved without impacting positions of the optical elements 310 and 312. For instance, the optical element 308 can be translated in a plane that is approximately orthogonal to the direction of light exiting the laser 200 through the aperture 218 (e.g., the optical element 308 can be translated in X and Y directions in such plane). In another example, the optical elements 308-312 can be physically coupled to one another and can be collectively translated in the X and Y directions in the aforementioned plane.

FIG. 3 also depicts portions of light that are reflected from the light directing elements of the lasers 200, 302, and 304. With reference to the laser 200 (shown in FIG. 2), the light directing element 220 is configured to redirect a portion of light emitted by the active medium 206 towards the optical sensor 205 array on the silicon IC 204. Sensors in the sensor array output sensor signals based upon this redirected portion of light, wherein the sensor signals are indicative of the precise position of the light director element 218 relative to the active medium 206. For instance, a sensor signal output by a sensor in the optical sensor array 205 may be indicative of angle of incidence of light that is incident upon the sensor, phase of the light that is incident upon the sensor, wavelength of light that is incident upon the sensor, and so forth. Accordingly, the sensor signal is indicative of the location of the light directing element 220 relative to the active medium 206, and the microcontroller on the silicon IC 204 can control the position of the light directing element 218 based upon the sensor signal.

A light directing element of an adjacent laser (e.g., the laser 302) can be configured to direct at least a portion of light emitted by the active medium of the adjacent laser 302 towards the optical sensor array 205 of the laser 200. Thus, sensors in the optical sensor array 205 of the laser 200 can be configured to receive light redirected by the light directing element 220 of the laser 200 as well as light redirected by the light directing element of the laser 302. The microcontroller on the silicon IC 204 of the laser 200 can receive sensor signals output by sensors of the optical sensor array 205 and can perform interferometric analysis on such signals, such that discrepancies between phase and wavelength of the two different sources of light can be ascertained. The microcontroller may then control componentry of the laser 200 based upon such interferometric analysis. For instance, the microcontroller can output a control signal that causes a temperature of the thermal management/electrical routing layer 202 to be altered in order to alter wavelength of light emitted by the active medium 206. In another example, the microcontroller can output a control signal that causes an amount of electoral energy provided to the active medium 206 to alter. In yet another example, the microcontroller can output a control signal that causes a position of the light directing element 220 to be altered based upon the interferometric analysis, modulation, filtering and computational analysis with respect to received sensor signals from sensors of the optical sensor array 205.

Further, the light directing element 220 of the laser 200 can be configured to redirect light emitted by the active medium 206 towards a waveguide of an adjacent laser (e.g., the laser 302) in the laser array 300. Additionally or alternatively, the light directing element 220 can be configured to redirect light emitted by the active medium 206 towards an optical sensor array of an adjacent laser in the laser array 300. As described above, wavelength and/or phase of the active medium of the laser 302 can be at least partially defined by the wavelength and/or phase of light redirected by the light directing elements 220 toward the waveguide of the laser 302.

Microcontrollers of the lasers 200, 302, and 304 can cause output beams to exit the lasers 200, 302, and 304 with desired wavelength and/or phase offsets (where such desired offsets may be zero), such that optical beam steering may occur and/or optical beam shaping may occur. For instance, a master processor that is external to the lasers 200, 302, and 304 may output signals that indicate desired wavelength and/or phase offsets to microcontrollers in the lasers 200, 202, and 304.

Further, while not shown, a narrow bandwidth, high precision light source can be configured to direct seed light into a waveguide of at least one of the lasers 200, 302, or 304 in the laser array 300. The waveguide then couples such light (which has a highly controlled wavelength and phase) into the active medium of the laser, which then begins emitting light that has a wavelength and phase that is at least partially defined based upon the wavelength and phase of the seed light. For example, the seed light can be directed into the waveguide layer 208 of the laser 200; the active medium 206 may then be configured to emit light having a wavelength and phase that is at least partially defined by the wavelength and phase of the seed light. The light directing element 220 directs at least some light emitted by the active medium 206 toward waveguides of adjacent lasers in the array 300, such that light emitted by active mediums of those lasers is at least partially defined by the wavelength and phase of the seed light. While each of the lasers 200, 302, and 304 are illustrated as including a respective waveguide, other embodiments are also contemplated. For instance, in some embodiments, the lasers 200, 302, and 304 may not include a waveguide; instead, an optical fiber can be coupled to an active medium of one of the lasers and the light directing element of such laser can direct some light in free space back towards the active mediums of other lasers in the laser array, such that the lasers are wavelength and phase-locked based upon light flowing through free space.

Figure 4:
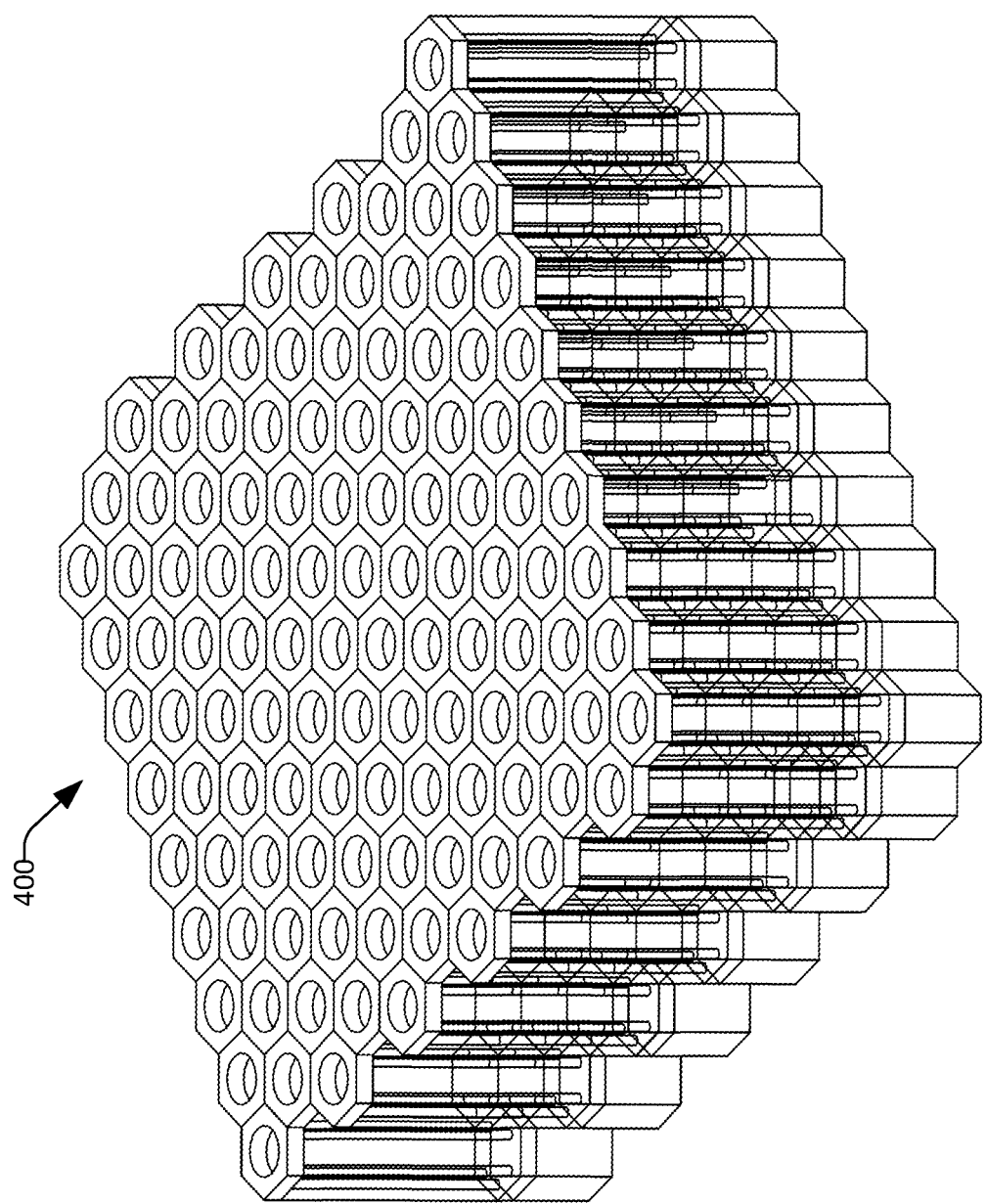
FIG. 4 is an isometric view of a laser array.
Figure 5:
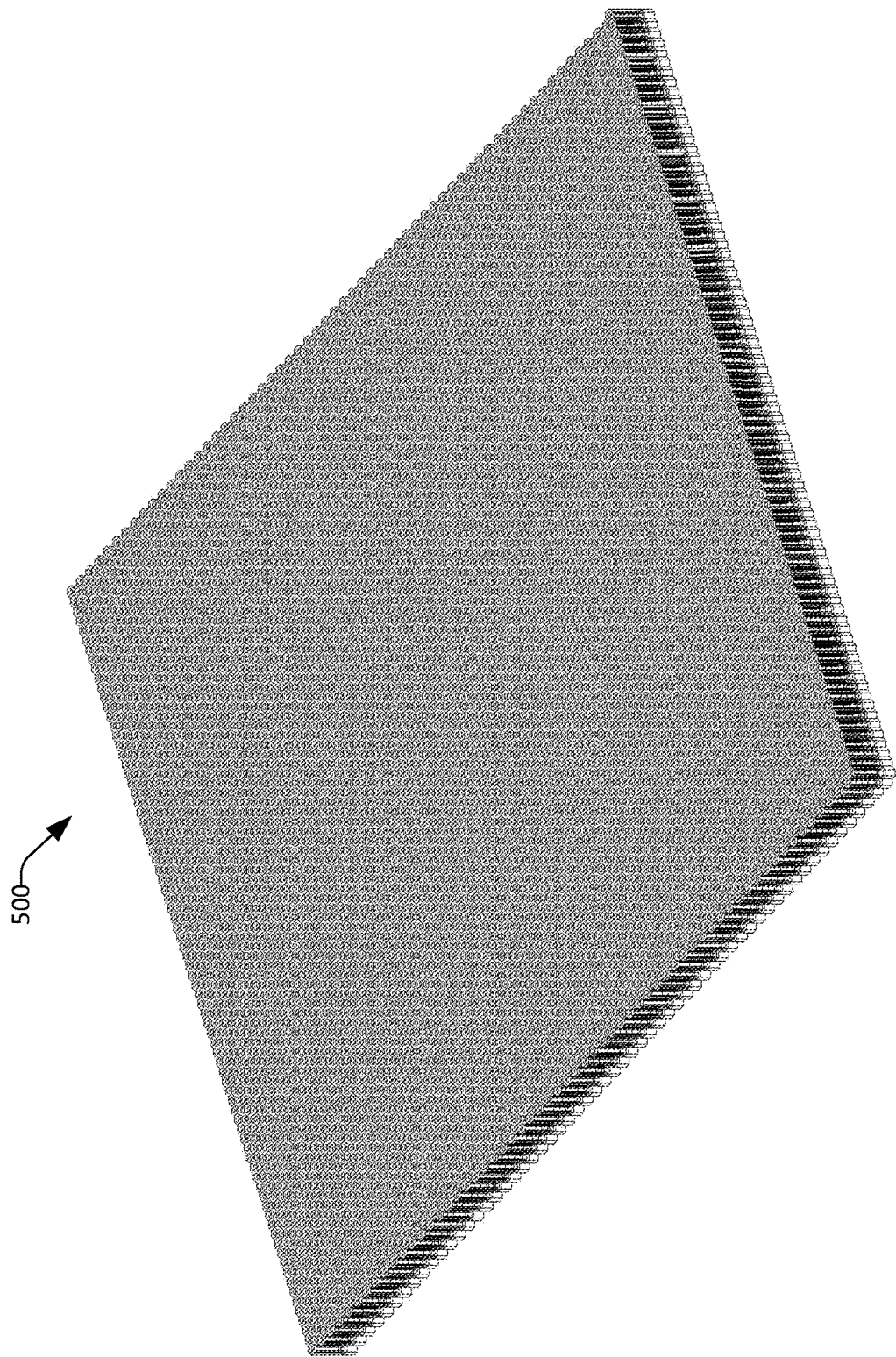
FIG. 5 is an isometric view of another laser array.

Now referring to FIG. 4, a laser array 400 that comprises a relatively large number of lasers is illustrated. It can be ascertained that a laser array can include 100, lasers 200, lasers, and so forth. With reference briefly to FIG. 5, an even larger laser array 500 is depicted, wherein the laser array 500 may comprise 1000, 2000, 3000, etc. lasers.

Figure 6:
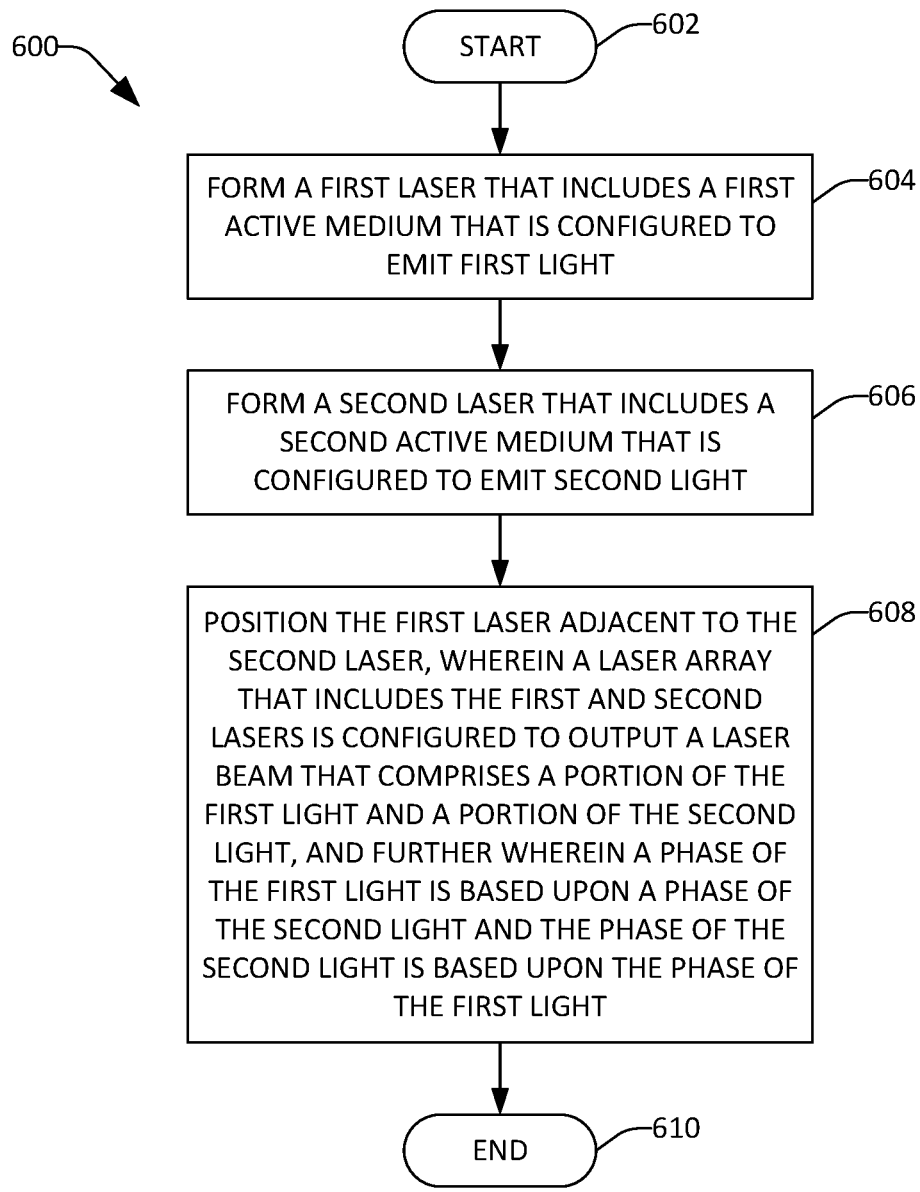
FIG. 6 is a flow diagram illustrating an exemplary methodology for forming a laser array.

FIGS. 6 and 7 illustrate exemplary methodologies relating to forming and operating a laser array. While the methodologies are shown and described as being a series of acts that are performed in a sequence, it is to be understood and appreciated that the methodologies are not limited by the order of the sequence. For example, some acts can occur in a different order than what is described herein. In addition, an act can occur concurrently with another act. Further, in some instances, not all acts may be required to implement a methodology described herein.

With reference now solely to FIG. 6, a flow diagram illustrating an exemplary methodology 600 for forming a laser array is illustrated. The methodology 600 starts at 602, and at 604 a first laser is formed, wherein the first later laser includes a first active medium that is configured to emit first light. As noted above, the first active medium is formed of a semi conductor. More specifically, the first active medium may be a compound semiconductor such GaAs.

At 606, a second laser is formed, wherein the second laser includes a second active medium that is configured to emit second light. For instance, the second active medium may be formed of the same semiconductor used to form the first active medium.

At 608, the first laser is positioned adjacent to the second laser in a laser array. The laser array is configured to output an optical beam that comprises a portion of the first light and a portion of the second light, wherein a wavelength and phase of the first light is based upon a wavelength and phase of the second light, and further wherein the wavelength and phase of the second light is based upon the wavelength and phase of the first light. Such codependency between the lasers allows for the resultant optical beam output by the laser array to be formed of outputs having the same wavelength and phase, for example (or controlled phase off-sets). The methodology 600 completes at 610.

Now referring to FIG. 7, a flow diagram illustrating an exemplary methodology 700 for operating a laser array is illustrated. The methodology 700 starts at 702, and at 704 seed light is coupled into a first active medium of a first laser in the laser array, wherein the first active medium may be formed of GaAs. At 706, electrical energy is provided to the first active medium to cause the first active medium to first emit light with a wavelength and phase that is based upon a wavelength and phase of the seed light coupled into the first active medium.

At 708, a first portion of the first light is redirected toward a waveguide of a second laser in the laser array, wherein the waveguide is configured to couple the first portion of the first light into a second active medium of the second laser, and further wherein a second portion of the first light is output from the first laser. At 710, electrical energy is provided to the second active medium, wherein the second active medium emits second light with a phase that is based upon a phase of the first portion of the first light that is coupled into the second active medium, and further wherein the phase of the first light is coherent with the phase of the second light. The second laser outputs a portion of the second light. A laser beam output by the laser array includes the second portion of the first light output by the first laser and the portion of the second light output by the second laser. The methodology 700 completes at 712.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A laser array comprising:
   a first laser comprising:
      a first active medium that is configured to emit first light, wherein the first laser outputs a first portion of the first light emitted by the first active medium; and
      a first light directing element that is optically coupled to the first active medium, the first light directing element configured to redirect a second portion of the first light that is different from the first portion of the first light; and
      a first waveguide that is optically coupled to the first active medium;
   a second laser that is adjacent to the first laser in the laser array, the second laser comprises:
      a second active medium that is configured to emit second light, wherein the second laser outputs a first portion of the second light emitted by the second active medium;
      a second light directing element that is optically coupled to the second active medium, the second light directing element configured to redirect a second portion of the second light that is different from the first portion of the second light; and
      a second waveguide that is optically coupled to the second active medium, wherein:
        the second waveguide is configured to:
          receive the second portion of the first light; and
          couple the second portion of the first light into the second active medium of the second laser, wherein the second light emitted by the second active medium has a first phase and a first wavelength that is at least partially defined by a second phase and a second wavelength of the second portion of the first light that is coupled into the second active medium; and
        the first waveguide is configured to:
          receive the second portion of the second light; and
          couple the second portion of the second light into the first active medium of the first laser, wherein the second phase and the second wavelength of the first light emitted by the first active medium is at least partially defined by the first phase and the first wavelength of the second portion of the second light coupled into the first active medium; and the laser array outputs an optical beam that comprises the first portion of the first light output by the first laser and the first portion of the second light output by the second laser.

2. The laser array of claim 1, wherein the first active medium and the second active medium are composed of a semiconductor.

3. The laser array of claim 2, wherein the semiconductor is gallium arsenide.

4. The laser array of claim 1, wherein the first light directing element comprises at least one of a mirror or a grating.

5. The laser array of claim 1, wherein the first laser and the second laser have a hexagonal cross-section.

6. The laser array of claim 1, further comprising a seed laser that emits seed light that is coupled into the first active medium, wherein the second phase and the second wavelength of the first light emitted by the first active medium is at least partially defined by a third phase and a third wavelength of the seed light emitted by the seed laser.

7. The laser array of claim 1, wherein the first laser further comprises a semiconductor integrated circuit (IC) that is electrically coupled to the first active medium, the semiconductor IC comprises an optical sensor and a microcontroller, wherein the optical sensor is configured to receive a third portion of the first light that is redirected by the first light directing element and is further configured to generate a sensor signal based upon the third portion of the first light, wherein the third portion of the first light is different from the first portion of the first light and the second portion of the first light, and further wherein the microcontroller is configured to control a position of the first light directing element of the first laser relative to the first active medium based upon the sensor signal.

8. The laser array of claim 1, wherein the first laser and the second laser are identical to one another.

9. The laser array of claim 1 comprising 100 lasers, wherein light output by each of the lasers is coherent with light output by each of the other lasers, and wherein the optical beam comprises the light output by each of the lasers.

10. The laser array of claim 1, wherein the first laser further comprises a semiconductor integrated circuit (IC) that is electrically coupled to the first light directing element, wherein the semiconductor IC comprises a microcontroller, and further wherein the microcontroller is configured to control position of the first light directing element to control an offset between the second phase of the first light emitted by the first active medium and the first phase of the second light emitted by the second active medium.

11. The laser array of claim 1, the first laser comprises a spacer layer that is positioned between the first active medium and the first light directing element, the spacer layer formed of glass.

12. A method of operating a laser array, the method comprising:

providing first electrical energy to a first active medium of a first laser in the laser array, wherein the first active medium emits first light with a first wavelength and a first phase;

directing a first portion of the first light towards a first waveguide of a second laser in the laser array, wherein the second laser is adjacent to the first laser in the laser array, the first waveguide couples the first portion of the first light into a second active medium of the second laser in the laser array, and further wherein a second portion of the first light is output from the first laser; and providing second electrical energy to the second active medium, wherein the second active medium emits second light with a second wavelength and a second phase that at least partially defined by the first wavelength and the first phase, wherein the second laser outputs a portion of the second light;

directing a first portion of the second light towards a second waveguide of the first laser, wherein the second waveguide couples the first portion of the second light into the first active medium, a second portion of the second light is output from the second laser, and further wherein an optical beam output by the laser array includes the second portion of the first light output by the first laser and the second portion of the second light output by the second laser.

13. A laser array comprising:

a first laser comprising:
 a first active medium that is configured to emit first light, wherein the first laser outputs a first portion of the first light emitted by the first active medium; and
 a light directing element that is optically coupled to the first active medium, the light directing element configured to redirect a second portion of the first light that is different from the first portion of the first light; and
 a semiconductor integrated circuit (IC) that is electrically coupled to the light directing element, wherein the semiconductor IC comprises a microcontroller; and a second laser that is adjacent to the first laser in the laser array, the second laser comprises:
 a second active medium that is configured to emit second light, wherein the second laser outputs a portion of the second light; and
 a waveguide that is configured to receive the second portion of the first light redirected by the light directing element of the first laser, the waveguide of the second laser is further configured to couple the second portion of the first light into the second active medium of the second laser, wherein second light emitted by the second active medium has a phase and a wavelength that is at least partially defined by a phase and a wavelength of the second portion of the first light that is coupled into the second active medium, wherein the laser array outputs an optical beam that comprises the first portion of the first light output by the first laser and the portion of the second light output by the second laser, and further wherein the microcontroller is configured to control position of the light directing element to control an offset between the phase of the first light emitted by the first active medium and the phase of the second light emitted by the second active medium.

14. The laser array of claim 13, wherein the first active medium and the second active medium are composed of a semiconductor.

15. The laser array of claim 14, wherein the semiconductor is gallium arsenide.

16. The laser array of claim 13, wherein the light directing element comprises at least one of a mirror or a grating.

17. The laser array of claim 13, wherein the first laser and the second laser have a hexagonal cross-section.

18. The laser array of claim 13, wherein the first laser and the second laser are identical to one another.

19. The laser array of claim 13 comprising 100 lasers, wherein light output by each of the lasers is coherent with light output by each of the other lasers, and wherein the optical beam comprises the light output by each of the lasers.

20. The laser array of claim 13, the first laser comprises a spacer layer that is positioned between the first active medium and the light directing element, the spacer layer formed of glass.

* * * * *